TRANSISTOR SWITCHING AND REGENERATIVE PULSE AMPLIFIER CIRCUIT
Filed July 31, 1956
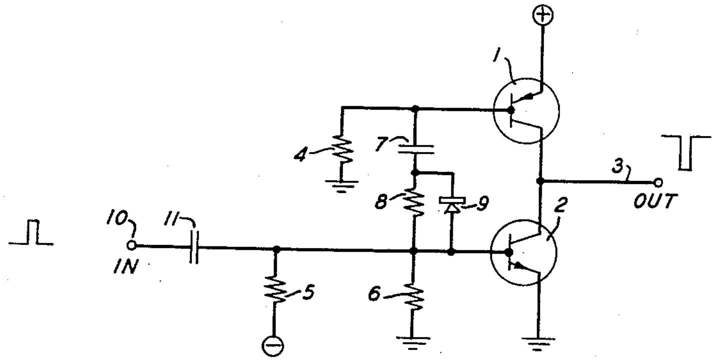
INVENTOR
S. T. MEYERS
BY R. B. Ardis
ATTORNEY United States Patent Office 2,933,692

Patented Apr. 19, 1960

2,933,692

TRANSISTOR SWITCHING AND REGENERATIVE PULSE AMPLIFIER CIRCUIT

Stanley T. Meyers, East Orange, N.J., assignor to Bell Telephone Laboratories, Incorporated, New York, N.Y., a corporation of New York Application July 31, 1956, Serial No. 601,271

7 Claims. (Cl. 330—18)

This invention relates generally to transistor switching circuits and more particularly, although in its broader aspects not exclusively, to transistor circuits for amplifying direct-current signal pulses on a regenerative basis.

A principal object of the invention is to increase the efficiency of regenerative transistor pulse amplifiers.

Another and more particular object is to minimize power loss in the operation of a regenerative transistor pulse amplifier.

Still another object is to increase the output power handling capacity of a regenerative transistor pulse amplifier.

In one important aspect, the invention takes the form of a regenerative pulse amplifier which operates by switching a high-current output connection back and forth between opposite sides of a fixed source of direct reference potential. In accordance with a principal feature of the present invention, a pair of junction transistor switches are connected in series across the reference potential source, with the common point between the two switches serving as a signal output connection. One of the transistor switches is normally biased closed by the reference potential source, while the other is normally biased open by an auxiliary source of direct potential. In accordance with a feature of the invention, an input signal pulse applied to both switches reverses the direction of their respective biases, causing the closed switch to open and the open switch to close. The biases return to normal upon termination of the input pulse, causing an output pulse of a magnitude determined by the reference potential source to be regenerated at the signal output connection. Since both transistor switches are at no time closed simultaneously, there is no loss of power because of low impedance paths through both switches simultaneously either during the life of or between signal pulses.

In its more specific embodiments, the invention is made up of a pair of junction transistors of opposite conductivity type having their collector electrodes connected together to form a signal output connection and their emitter electrodes connected to opposite sides of the source of direct reference potential. In accordance with a feature of the invention, the reference potential source is poled in the direction of positive emitter current flow in both transistors, one transistor is normally provided with a forward emitter bias from the reference potential source, and the other transistor is normally provided with a reverse emitter bias from an auxiliary direct potential source. Under these conditions, the internal emitter-collector path of the first transistor is in its low impedance state, while that of the second is in its high impedance state, causing the signal output connection to be connected directly to one side of the reference potential source through the first transistor. In accordance with a feature of the present invention, a signal pulse is applied to the base electrodes of both transistors to reverse the respective emitter biases. When this happens, the signal output connection becomes effectively isolated from the side of the reference source to which it was formerly connected and becomes connected to the other side through the low impedance path formed by the second transistor.

A more complete understanding of the invention may be obtained from a study of the following detailed description of the specific embodiment illustrated in the single figure of the drawing.

In the illustrated embodiment of the invention, a p-n-p junction transistor 1 has its emitter electrode connected directly to the positive terminal of the direct reference potential source and an n-p-n junction transistor 2 has its emitter electrode connected to ground. A D.-C. circuit path is thereby provided between the two emitter electrodes which includes the direct reference potential source, the latter being poled in the direction of forward emitter current flow in both transistors. The collector electrodes of the two transistors are connected directly together and to a signal output terminal 3. The base electrode of transistor 1 is returned to ground through a resistor 4, while the base electrode of transistor 2 is returned to an auxiliary negative potential source through a resistor 5. The base electrode of transistor 2 is also returned directly to ground through a resistor 6.

The base electrodes of transistors 1 and 2 are A.-C. coupled through a capacitor 7 in series with the parallel combination of a resistor 8 and a diode 9. Diode 9 is poled for easy current flow away from transistor 2 toward transistor 1. The signal input terminal 10 is connected through a coupling capacitor 11 to the base electrode of transistor 2.

The embodiment of the invention illustrated in the drawing operates to switch a high-current lead, represented by output terminal 3, back and forth between the positive side of the main D.-C. reference supply source and ground. When the circuit is in its quiescent state, current flows from the supply source through the internal emitter-base path of p-n-p transistor 1 and resistor 4 to ground, providing a forward bias which maintains the internal emitter-collector path of transistor 1 in its low impedance condition. Since the switch formed by the internal emitter-collector path of transistor 1 is thus closed, current is driven into the output connection represented by terminal 3 from the positive side of the reference supply source. The n-p-n transistor 2 has its internal emitter-base path back biased by the negative potential developed across resistor 6 by the current through resistor 5 from the negative supply. The internal emitter-collector path of transistor 2 is thereby maintained in its high impedance condition, effectively isolating output terminal 3 from ground. The combination of resistor 8 and diode 9 prevents possibly damaging collector current from flowing through both transistors because of the high base current which could otherwise flow in both transistors when power from the reference voltage source is first applied to the circuit and condenser 7 has not reached a fully charged state.

Application of a positive-going signal pulse to input terminal 10 in the illustrated embodiment of the invention provides a simultaneous positive-going drive on the base electrodes of both transistors 1 and 2. The p-n-p transistor 1 is first turned off and the n-p-n transistor 2 is then turned on. In other words, the normal forward bias from the reference voltage source on the internal emitter base path of transistor 1 is overcome and reversed in polarity, switching the internal emitter-collector path to its high impedance condition and isolating output terminal 3 from the positive side of the reference voltage source. Just after the bias on transistor 1 is reversed in polarity, the normal reverse bias from resistor 5 and the associated auxiliary negative potential source on the internal emitter base path of transistor 2 is also overcome and reversed in sense. With the resulting forward emitter bias, the initial emitter-collector path of transistor 2 is switched to its low impedance condition, effectively connecting output terminal 3 to ground. Upon termination of the input pulse at terminal 10, the n-p-n transistor 2 turns off and the p-n-p transistor 1 turns on restoring the circuit to its initial condition. The resulting output pulse at terminal 3 is inverted in polarity from the input pulse, but is of the same length and is of the standard amplitude fixed by the direct reference potential source connected between the transistor emitter electrodes.

The operating advantages made possible by the present invention are several. In the first place, at no time in the operating cycle is the positive potential at the emitter electrode of transistor 1 shorted directly to ground through the two transistors. During the life of a positive input pulse, the positive potential is effectively removed from the circuit instead. If the signal output terminal 3 were merely connected to the positive side of the reference source and shorted to ground during the life of a positive input pulse, there would be a severe power drain from the reference source and a corresponding loss in efficiency. In the illustrated embodiment of the invention, there is substantially no power drain while the output terminal 3 is shorted to ground and efficiency is considerably greater. In the second place, the total amount of power than can safely be drawn from the D.-C. reference source without risk of damage to the transistors is limited by the maximum current which is permitted to flow in the internal emitter collector paths of the transistors. If there were intervals in the operating cycle when the total impedance to ground from the positive side of the reference source would be very low, it would be necessary to add resistance to the path to protect the transistors, thereby limiting at the same time the current available to the external load circuit. In the illustrated embodiment of the invention, the smallest impedance that ever appears between the positive side of the reference source and ground is the impedance of the internal emitter-collector path of one of the transistors in its high impedance condition in parallel with the output load circuit. No dangerous currents to ground are possible and no additional resistance to protect the transistors from damage is needed.

It is to be understood that the above-described arrangement is illustrative of the application of the principles of the invention. Numerous other arrangements may be devised by those skilled in the art without departing from the spirit and scope of the invention.

What is claimed is:

1. In combination, a pair of transistors of opposite conductivity type each having an emitter electrode, a collector electrode, and a base electrode, a first circuit path interconnecting the emitter electrodes of said transistors, a second circuit path interconnecting the collector electrodes of said transistors, one of said circuit paths including a source of electrical energy and the other of said circuit paths including a signal output connection, means to forward bias the internal emitter-base path of one of said transistors, means to reverse bias the internal emitter-base path of the other of said transistors, and means to reverse the direction of the biases on the respective internal emitter-base paths of both of said transistors simultaneously under the control of signal pulses, whereby said signal output connection is switched back and forth between opposite sides of said sources in response to signal pulses.

2. In combination, a pair of transistors of opposite conductivity type each having an emitter electrode, a collector electrode, and a base electrode, a first D.-C. circuit path interconnecting the emitter electrodes of said transistors, a second D.-C. circuit path interconnecting the collector electrodes of said transistors, one of said circuit paths including a source of direct potential and the other of said circuit paths including a signal output connection, means to forward bias the internal emitter-base path of one of said transistors, means to reverse bias the internal emitter-base path of the other of said transistors, and means to reverse the direction of the biases on the respective internal emitter-base paths of both of said transistors simultaneously under the control of signal pulses, whereby said signal output connection is switched back and forth between opposite sides of said sources in response to signal pulses.

3. In combination, a pair of transistors of opposite conductivity type each having an emitter electrode, a collector electrode, and a base electrode, a first D.-C. circuit path interconnecting the emitter electrodes of said transistors, a second D.-C. circuit path interconnecting the collector electrodes of said transistors, said first circuit path including a source of direct potential poled in the direction of forward emitter current flow in both of said transistors and said second circuit path including a signal output connection, means to forward bias the internal emitter-base path of one of said transistors, means to reverse bias the internal emitter-base path of the other of said transistors, and means to reverse the direction of the biases on the respective internal emitter-base paths of both of said transistors simultaneously under the control of signal pulses, whereby said signal output connection is switched back and forth between opposite sides of said source in response to signal pulses.

4. In combination, first and second transistors of opposite conductivity type each having an emitter electrode, a collector electrode, and a base electrode, a first D.-C. circuit path interconnecting the emitter electrodes of said transistors, a second D.-C. circuit path interconnecting the collector electrodes of said transistors, said first circuit path including a first source of direct potential poled in the direction of forward emitter current flow in both of said transistors and said second circuit path including a signal output connection, means to forward bias the internal emitter-base path of said first transistor from said first source, means including a second source of direct potential connected to reverse bias the internal emitter-base path of said second transistor, and means to reverse the direction of the biases on the respective internal emitter-base paths of both of said transistors simultaneously under the control of signal pulses, whereby said signal output connection is switched back and forth between opposite sides of said source in response to signal pulses.

5. A combination in accordance with claim 4 in which said last-mentioned means includes means to apply D.-C. signal pulses of the polarity biasing the internal emitter-base path of said second transistor in the forward direction to the base electrode of said second transistor and a coupling path between the base electrodes of said transistors in the form of a capacitor in series with the parallel combination of a resistor and a diode, said diode being poled to present a low impedance to direct current of the polarity reverse biasing the internal emitter-base path of said first transistor, whereby said resistor prevents possible high base currents from said first source of direct potential from damaging either of said transistors.

6. In combination, a source of electrical energy, a pair of transistor switches connected in series across said source, a signal output connection between said transistor switches, means to bias one of said transistor switches closed, means to bias the other of said transistor switches open, and signal input means to reverse the direction of the biases on both of said transistor switches simultaneously.

7. In combination, a source of direct potential, a pair of transistor switches connected in series across said source, a signal output connection between said transistor switches, means to bias one of said transistor switches closed, means to bias the other of said transistor switches open, and means to reverse the direction of the biases on both of said transistor switches simultaneously under the control of signal pulses.

References Cited in the file of this patent

UNITED STATES PATENTS

| | | |
|---|---|---|
| 2,641,717 | Toth | June 9, 1953 |
| 2,666,818 | Schockley | Jan. 19, 1954 |

| | | |
|---|---|---|
| 2,757,243 | Thomas | July 31, 1956 |
| 2,809,303 | Collins | Oct. 8, 1957 |
| 2,838,675 | Wanlass | June 10, 1958 |
| 2,843,743 | Hamilton | July 15, 1958 |
| 2,860,195 | Stanley | Nov. 11, 1958 |
| 2,864,961 | Lohman et al. | Dec. 16, 1958 |
| 2,880,332 | Wanlass | Mar. 31, 1959 |